United States Patent
Moon et al.

(10) Patent No.: US 7,625,695 B2
(45) Date of Patent: Dec. 1, 2009

(54) POLYMERS FOR ANTI-REFLECTIVE COATINGS, ANTI-REFLECTIVE COATING COMPOSITIONS AND METHODS OF FORMING A PATTERN USING THE SAME

(75) Inventors: Sang-Sik Moon, Hwseong-si (KR); Ji-Young Kim, Suwon-si (KR); Joon-Seok Oh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 272 days.

(21) Appl. No.: 11/844,365

(22) Filed: Aug. 24, 2007

(65) Prior Publication Data
US 2008/0050678 A1 Feb. 28, 2008

(30) Foreign Application Priority Data
Aug. 24, 2006 (KR) .................. 10-2006-0080391
Jun. 14, 2007 (KR) .................. 10-2007-0058132

(51) Int. Cl.
*G03F 7/40* (2006.01)
*C08F 16/02* (2006.01)
*C08F 116/02* (2006.01)
*C08F 216/02* (2006.01)
*G03F 7/11* (2006.01)

(52) U.S. Cl. .................. 430/323; 430/271.1; 430/313; 430/317; 525/328.8

(58) Field of Classification Search .............. 525/328.8
See application file for complete search history.

(56) References Cited

U.S. PATENT DOCUMENTS

| 4,401,659 A | * | 8/1983 | Lefrancier et al. | 514/8 |
| 5,591,871 A | * | 1/1997 | Suzuki et al. | 549/299 |
| 2002/0098567 A1 | * | 7/2002 | Vaidya et al. | 435/206 |
| 2004/0082023 A1 | * | 4/2004 | Gross et al. | 435/41 |
| 2007/0072096 A1 | * | 3/2007 | Takakuwa et al. | 430/7 |

FOREIGN PATENT DOCUMENTS

| JP | 2000-313779 A | * | 11/2000 |
| KR | 10-0465866 B1 | * | 12/2004 |
| KR | 10-0492796 B1 | * | 5/2005 |

* cited by examiner

*Primary Examiner*—Cynthia Hamilton
(74) *Attorney, Agent, or Firm*—Volentine & Whitt, PLLC

(57) ABSTRACT

An anti-reflective coating composition includes a solvent and about 20 to about 35 percent by weight of a polymer prepared by a condensation reaction of an acrylate polymer including a hydroxyl group with a derivative of muramic acid and a derivative of mandelic acid.

14 Claims, 4 Drawing Sheets

POLYMERS FOR ANTI-REFLECTIVE COATINGS, ANTI-REFLECTIVE COATING COMPOSITIONS AND METHODS OF FORMING A PATTERN USING THE SAME

CROSS-REFERENCE TO RELATED APPLICATIONS

A claim of priority under 35 U.S.C. §119 is made to Korean Patent Application No. 2006-80391, filed Aug. 24, 2006, and Korean Patent Application No. 2007-58132, filed Jun. 14, 2007, the contents of which are herein incorporated by reference in their entireties.

BACKGROUND OF THE INVENTION

1. Field of the Invention

Example embodiments of the present invention relate to polymers for anti-reflective coatings, anti-reflective coating compositions including the polymers, and methods of forming a pattern using the anti-reflective coating compositions.

2. Description of the Related Art

In the fabrication of semiconductor devices, a layer is typically patterned by utilizing a photoresist pattern as an etching mask. An anti-reflective film or an anti-reflective coating (ARC) film is often formed on the to-be-patterned layer, and then a photoresist film is formed on the anti-reflective film.

The anti-reflective film generally functions to reduce or prevent reflection of light from an underlying layer while the photoresist film is exposed to light in an exposure process. In particular, the anti-reflective film may suppress a standing wave effect that can be generated by interference between incident light entering the photoresist film and reflection light reflecting from the underlying layer.

The anti-reflective film can substantially reduce the reflection of irregular light from patterns formed on a substrate and/or diffused light from an edge of a structure formed on a substrate. In this manner, the anti-reflective film may be effective in the formation of a photoresist pattern with a precise critical dimension and may improve process tolerances of the semiconductor manufacturing process.

Anti-reflective films are generally classified as either organic anti-reflective films or inorganic anti-reflective films. Inorganic anti-reflective films exhibit favorable adhesiveness to an underlying structure having a stepped portion. However, inorganic anti-reflective films may not be readily removed from a substrate, and may exhibit relatively poor adhesiveness to a photoresist film subsequently formed on the anti-reflective film. Organic anti-reflective films may overcome these drawbacks of inorganic anti-reflective films, but still may be deficient in achieving a desired photoresist pattern profile or patterned layer profile.

SUMMARY OF THE INVENTION

According to one aspect of the present invention, a polymer for an anti-reflective coating includes a polymer prepared by a condensation reaction of an acrylate polymer including a hydroxyl group with a first compound represented by Formula 1 and a second compound represented by Formula 2,

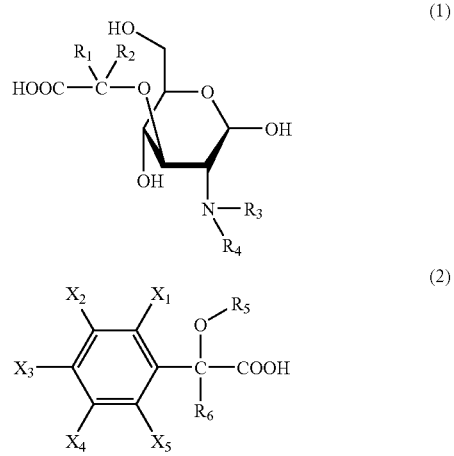

In Formulas 1 and 2, $R_1$ and $R_2$ independently denote a hydrogen atom or a $C_1$-$C_4$ alkyl group, $R_3$ and $R_4$ independently denotes a hydrogen atom, a $C_2$-$C_6$ alkylcarbonyl group or a $C_1$-$C_4$ alkyl group, $R_5$ denotes a hydrogen atom or a $C_2$-$C_6$ alkylcarbonyl group, $R_6$ denotes a hydrogen atom or a $C_1$-$C_4$ alkyl group, and $X_1$, $X_2$, $X_3$, $X_4$ and $X_5$ independently denote a hydrogen atom, a hydroxyl group, a $C_1$-$C_4$ alkyl group or a $C_1$-$C_4$ alkoxy group.

According to another aspect of the present invention, an anti-reflective coating composition includes a solvent and about 20 to about 35 percent by weight of a polymer prepared by a condensation reaction of an acrylate polymer including a hydroxyl group with a first compound represented by Formula 1 and a second compound represented by Formula 2.

According to another aspect of the present invention, there is provided a method of forming a pattern. In the method, a layer is formed on a substrate, and then an anti-reflective film is formed on the layer by using an anti-reflective coating composition that includes a solvent and about 20 to about 35 percent by weight of a polymer prepared by a condensation reaction of an acrylate polymer including a hydroxyl group with a first compound represented by Formula 1 and a second compound represented by Formula 2. After a photoresist pattern is formed on the anti-reflective film, the anti-reflective film and the layer are sequentially etched using the photoresist pattern as an etching mask to thereby form an anti-reflective pattern and the pattern on the substrate.

BRIEF DESCRIPTION OF THE DRAWINGS

The above and other features and advantages of the present invention will become readily apparent from the detailed description that follows, with reference to the accompanying drawings, in which.

DESCRIPTION OF EMBODIMENTS

Figure 1:
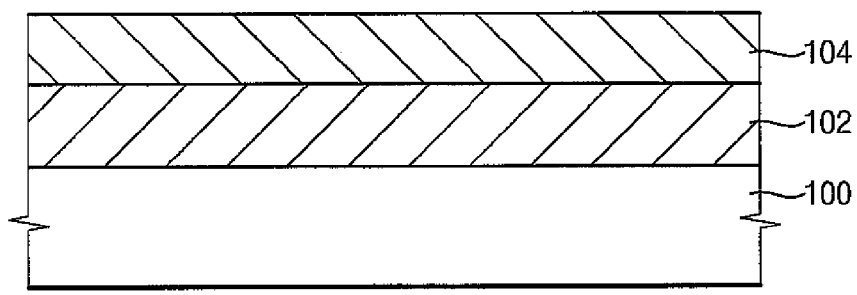
FIGS. 1-5 are cross-sectional views for use in describing a method of forming a pattern using an anti-reflective coating composition in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Polymer for Anti-Reflective Coatings

A polymer for an organic anti-reflective coating according to example embodiments of the present invention may improve profiles of a photoresist pattern. The polymer may have enhanced optical properties, etching properties and coatabilities. An anti-reflective film formed using the polymer may exhibit the following characteristics:

The anti-reflective film may have a proper optical constant with respect to a light source employed in a semiconductor manufacturing process. For example, the anti-reflective film may have a refractive index (n) and an absorption coefficient (k) of light, both of which are adequate to suppress interference between incident light generated from a light source and light reflecting from an underlying layer. Thus, the anti-reflective film may reduce or prevent the generation of an undercut phenomenon at a lower portion of a photoresist pattern. Additionally, the anti-reflective film may have an improved etching property. After a photoresist pattern is formed on the anti-reflective film, an exposed portion of the anti-reflective film between photoresist patterns may be selectively removed from a substrate at a high etching rate relative to a removal rate of a photoresist pattern. Furthermore, the anti-reflective film may have favorable coatability and uniformity of a coating film. The anti-reflective film may have a favorable stability when exposed to a solvent or heat. Therefore, the anti-reflective film may not be readily removed by a solvent or heat, and a chemical byproduct may not be generated from the anti-reflective film while a photoresist pattern is formed on the anti-reflective film.

The polymer for an anti-reflective coating according to example embodiments of the present invention includes a polymer prepared by a condensation reaction of an acrylate polymer having a hydroxyl group with a first compound represented by Formula 1 and a second compound represented by Formula 2,

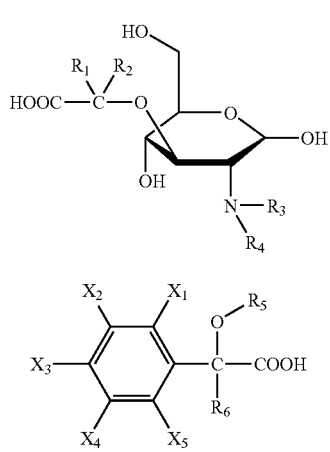

(1)

(2)

In Formulas 1 and 2, $R_1$ and $R_2$ independently denote a hydrogen atom or a $C_1$-$C_4$ alkyl group, $R_3$ and $R_4$ independently denote a hydrogen atom, a $C_2$-$C_6$ alkylcarbonyl group or a $C_1$-$C_4$ alkyl group, $R_5$ denotes a hydrogen atom or a $C_2$-$C_6$ alkylcarbonyl group, $R_6$ denotes a hydrogen atom or a $C_1$-$C_4$ alkyl group, and $X_1$, $X_2$, $X_3$, $X_4$ and $X_5$ independently denote a hydrogen atom, a hydroxyl group, a $C_1$-$C_4$ alkyl group or a $C_1$-$C_4$ alkoxy group. Herein, "independently" means that $R_1$ and $R_2$, for example, can be the same as each other or different from each other.

In some example embodiment of the present invention, the polymer may be a product of the condensation reaction of the acrylate polymer with the first compound and the second compound. In other example embodiments of the present invention, the polymer may be a product of a cross-linking reaction of a cross-linking agent with the acrylate polymer, the first compound and the second compound.

Examples of the acrylate polymer having a hydroxyl group may include poly(hydroxyethyl(meth)acrylate), poly(hydroxybutyl(meth)acrylate), poly(hydroxypropyl(meth)acrylate), poly(hydroxymethyl(meth)acrylate), poly(hydroxypentyl(meth)acrylate), and poly(hydroxyhexyl(meth)acrylate). These may be used alone or in a combination of two or more thereof.

In example embodiments of the present invention, the acrylate polymer may be a copolymer of the above-mentioned acrylate polymer having the hydroxyl group and another type of polymer such as polyester, polysulfone, polyamide, poly(vinylalcohol) and the like.

In example embodiments of the present invention, the polymer for an anti-reflective coating may further include a chromophore such as a substituted or unsubstituted aryl group. Examples of the aryl group may include an anthracenyl group, a naphthyl group, and a phenyl group.

The first compound represented by Formula 1 may enhance a cross-linking between chains of the acrylate polymer.

Examples of the first compound represented by Formula 1 may include N-acetylmuramic acid, muramic acid or a combination thereof. For example, N-acetylmuramic acid may be represented by Formula 3.

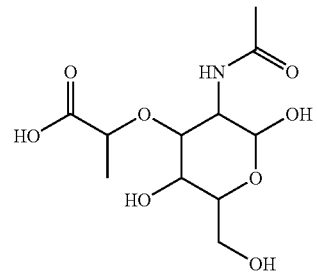

(3)

When the polymer includes less than about 0.0015 percent by weight of the first compound, insufficient cross-linking of chains of the acrylate polymer may result which can deteriorate a solvent resistance of the polymer and excessively lower an absorbance of light. Additionally, when the amount of the first compound is greater than about 0.0023 percent by weight, an etch rate of the anti-reflective film may decrease, and an increased absorbance may generate an undercut of a photoresist pattern formed on the anti-reflective film. Therefore, the polymer may include the first compound in a range of about 0.0015 to about 0.0023 percent by weight based on a total weight of the polymer, and preferably in a range of about 0.0018 to about 0.0022 percent by weight.

Examples of the second compound represented by Formula 2 may include 4-hydroxy-3-methoxymandelic acid, mandelic acid, and acetylmandelic acid. These may be used alone or in a combination of two or more thereof. For example, 4-hydroxy-3-methoxymandelic acid may be represented by Formula 4.

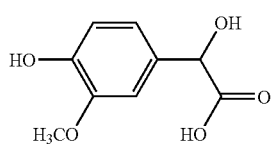

(4)

The second compound represented by Formula 2 may improve the coatability and uniformity of the anti-reflective film.

When the amount of the second compound is less than about 0.0008 percent by weight, a coatability of the anti-reflective film may be poor which can result in the anti-reflective film not being properly formed on a layer to be etched. Additionally, when the amount of the second compound is greater than about 0.0013 percent by weight, a uniformity of the anti-reflective film may deteriorate. Therefore, the polymer may include the second compound in a range of about 0.0008 to about 0.0013 percent by weight, and preferably in a range of about 0.0009 to about 0.0012 percent by weight.

In example embodiments of the present invention, the polymer may be prepared by using a cross-linking agent together with the acrylate polymer, the first compound and the second compound. The cross-linking agent may increase a cure degree of the anti-reflective film. The cross-linking agent may be a monomeric compound that may cross-link a polymer having a functional group such as a hydroxyl group, an amide group, a carboxylic group or a thiol group. Examples of the cross-linking agent may include hydroxymethyl melamine, an alkoxymethyl melamine, a urea-formaldehyde resin, benzyl ether, benzyl alcohol, an epoxy compound, a phenol resin, an isocyanate compound, an alkylol acrylamide, and methacrylamide. These may be used alone or in a combination of two or more thereof.

In example embodiments of the present invention, the polymer for the anti-reflective coating may have an average molecular weight in a range from about 5,000 to about 30,000, and preferably in a range from about 10,000 to about 20,000, so as to improve a viscosity and/or a coatability of an anti-reflective coating composition including the polymer.

Anti-Reflective Coating Composition

An anti-reflective coating composition according to example embodiments of the present invention includes about 20 to about 35 percent by weight of the previously described polymer for an anti-reflective coating prepared by a condensation reaction of an acrylate polymer including a hydroxyl group with a first compound represented by Formula 1 and a second compound represented by Formula 2, and a solvent. The solvent may constitute all or a portion of the remainder of the coating composition.

When the anti-reflective coating composition includes less than about 20 percent by weight of the polymer for the anti-reflective coating, an adhesiveness of an anti-reflective film may deteriorate. In addition, when the amount of the polymer is greater than about 35 percent by weight, a solubility of the polymer with respect to the solvent may decrease. Therefore, the anti-reflective coating composition includes the polymer in a range of about 20 to about 35 percent by weight.

When the anti-reflective coating composition includes less than about 75 percent by weight of the solvent, a viscosity of the anti-reflective coating composition may excessively increase which can cause a uniformity of the anti-reflective film to become poor. Additionally, when the amount of the solvent is greater than about 80 percent by weight, an amount of fumes generated from an anti-reflective film may disadvantageously increase. Thus, the anti-reflective coating composition includes about 75 to about 80 percent by weight of the solvent.

The solvent, which may dissolve the polymer for the anti-reflective coating, preferably exhibits a low toxicity and forms an anti-reflective film having a uniform thickness.

Examples of the solvent that may be used for the anti-reflective coating composition may include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol methyl ether, propylene glycol methyl ether acetate, propylene glycol propyl ether acetate, diethylene glycol dimethyl ether, ethyl lactate, toluene, xylene, methyl ethyl ketone, cyclohexanone, 2-heptanone, 3-heptanone, 4-heptanone, γ-butyrolactone, and N-methyl-2-pyrrolidone. These may be used alone or in a combination of two or more thereof.

According to the present invention, the anti-reflective coating composition including the polymer having the first compound represented by Formula 1 and the second compound represented by Formula 2 may form an anti-reflective film that has a uniform thickness and enhanced etching characteristics. Additionally, the anti-reflective coating composition including a stable polymer may suppress or reduce generation of fume while a photoresist pattern is formed on the anti-reflective film.

In example embodiments of the present invention, the anti-reflective coating composition may include one or more additives such as a cross-linking accelerator, a surface retardant, an adhesion accelerator, an anti-forming agent and the like. The type and/or an amount of additive may be properly adjusted to improve characteristics of the anti-reflective film.

Method of Forming a Pattern

Figure 5:
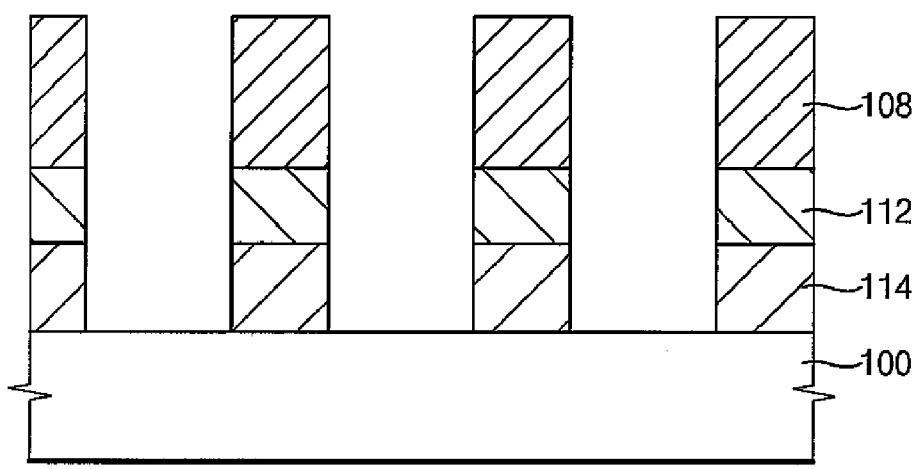

FIGS. 1 and 5 are cross-sectional views illustrating a method of forming a pattern using an anti-reflective coating composition in accordance with example embodiments of the present invention.

Referring to FIG. 1, an object to be etched is prepared. Examples of the object may include a semiconductor substrate 100 and a thin film 102 formed on a substrate 100. Examples of the thin film 102 may include a silicon nitride layer, a polysilicon layer, a silicon oxide layer, and the like. The substrate 100 including the thin film 102 may be cleaned so as to remove contaminants from the thin film 102.

The cleaned thin film 102 is coated with an anti-reflective coating composition including about 20 to about 35 percent by weight of a polymer prepared by a condensation reaction of an acrylate polymer including a hydroxyl group with a first compound represented by Formula 1 and a second compound represented by Formula 2, and a remainder of a solvent. The anti-reflective coating composition may be applied to the thin film 102 by a spin coating process.

A drying process and a baking process are performed on the substrate 100 to which the anti-reflective coating composition is applied. As a result, an anti-reflective film 104 is formed on the thin film 102. The baking process may be carried out at a temperature of about 100° C. to about 150° C., and preferably at a temperature of about 100° C. to about 130° C. The components of the anti-reflective coating composition have been previously described.

Figure 2:
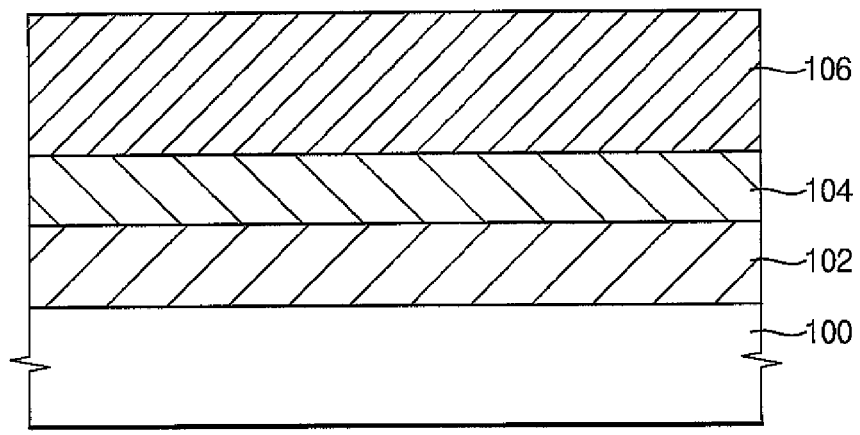

Referring to FIG. 2, a photoresist film 106 is formed on the anti-reflective film 104 by coating the anti-reflective film with a photoresist composition.

Examples of the photoresist composition may include a positive photoresist having a naphthoquinone diazide compound and a novolac resin, a positive photoresist having a photoacid generator, an acid-labile compound and an alkali-soluble resin, a positive photoresist having a photoacid generator and an alkali-soluble resin having an acid-labile group, and the like.

A first baking process is performed on the substrate 100 on which the photoresist film 106 is formed. The first baking process may be carried out, for example, at a temperature of about 90° C. to about 120° C. In the first baking process, an adhesiveness between the photoresist film 106 and the anti-reflective film 104 may be enhanced.

Figure 3:
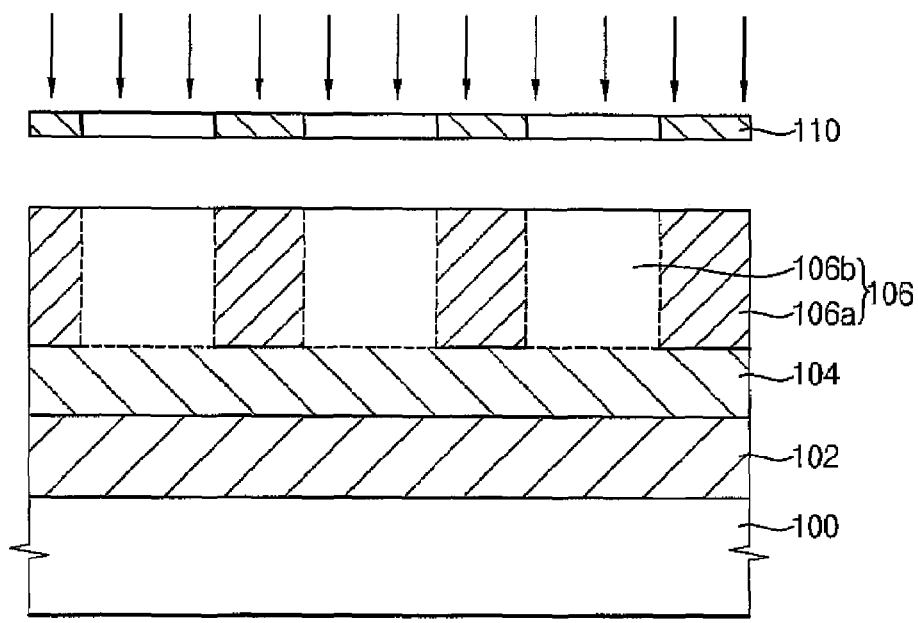

Referring to FIG. 3, the photoresist film 106 is partially exposed to light in an exposure process. In example embodiments of the present invention, a mask 110 having a predetermined pattern may be positioned on a mask stage of an exposure apparatus, and then the mask 110 is aligned over the photoresist film 106. A portion of the photoresist film 106 formed on the substrate 100 may be selectively reacted with light transmitted through the mask 110 while the light is irradiated on the mask 110 for a predetermined time period. An example of the light that may be used in the exposure process may include an ArF laser having a wavelength of about 193 nm.

An exposed portion 106b of the photoresist film 106 may be more hydrophilic than an unexposed portion 106a of the photoresist film 106. Accordingly, the exposed portion 106b and the unexposed portion 106a of the photoresist film 106 may have different solubilities from each other.

Subsequently, a second baking process may be performed on the substrate 100. The second baking process may be performed, for example, at a temperature of about 90° C. to about 150° C. In the second baking process, the exposed portion 106b of the photoresist film 106 may become soluble in a developing solution.

Figure 4:
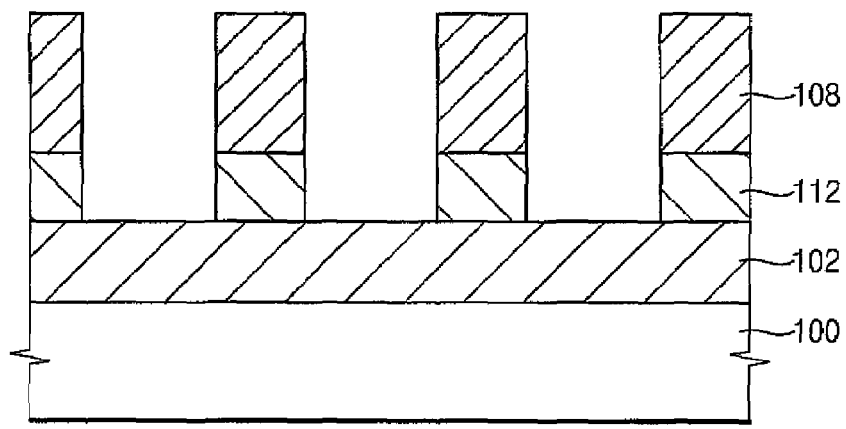

Referring to FIG. 4, a photoresist pattern 108 is formed by dissolving the exposed portion 106b of the photoresist film 106 into a developing solution and then removing the exposed portion 106b from the photoresist film 106. For example, the exposed portion 106b of the photoresist film 106 may be removed by dissolving the exposed portion 106b into an aqueous solution of tetramethylammonium hydroxide.

Subsequently, the anti-reflective film 104 is partially etched using the photoresist pattern 108 as an etching mask. As a result, an anti-reflective pattern 112 is formed on the substrate 100.

Referring to FIG. 5, the thin film 102 is partially etched using the photoresist pattern 108 as an etching mask to form a thin film pattern 114 on the substrate 100.

Embodiments of the present invention will be described in more detail with reference to examples of preparing a polymer for an anti-reflective coating and an anti-reflective coating composition having the polymer. However, it will be understood that the present invention is not limited by the following examples.

Synthesis of a Polymer for an Anti-Reflective Coating

EXAMPLE 1

About 99.997 parts by weight of SSAC650 (a trade name manufactured by Rohm and Hass, U.S.A.), which is polymethacrylate having a hydroxyl group, about 0.0020 parts by weight of N-acetylmuramic acid, and a small quantity of methanol were added to a solvent of tetrahydrofuran. A first condensation reaction was carried out by stirring this mixture at room temperature for about three hours. A product of the first condensation reaction and about 0.0010 parts by weight of 4-hydroxy-3-methoxymandelic acid were added to tetrahydrofuran, and then a second condensation reaction was performed by stirring the mixture at room temperature for about five hours. A product of the second condensation reaction was separated from the mixture to thereby obtain a polymer for an anti-reflective coating.

Preparation of an Anti-Reflective Coating Composition

EXAMPLE 2

About 30 percent by weight of the polymer prepared in Example 1 was dissolved in about 70 percent by weight of propylene glycol monomethyl ether acetate, and then this mixture was filtered using a membrane filter having a pore diameter of about 0.2 μm. As a result, an anti-reflective coating composition was prepared.

COMPARATIVE EXAMPLES 1 AND 2

Anti-reflective coating compositions were prepared by performing processes substantially the same as those in Example 2 except that conventional polymers for an anti-reflective coating were used instead of the polymer prepared in Example 1. SNAC2002 (a trade name manufactured by Nissan, Japan) that was polymethacrylate was used in Comparative Example 1, and SSAC650 (a trade name manufactured by Rohm and Hass, U.S.A.) that was polymethacrylate having a hydroxyl group was used in Comparative Example 2.

Evaluation of Characteristics of an Anti-Reflective Film

A coating was formed on a substrate by performing a spin coating process using each of the anti-reflective coating compositions prepared in Example 2 and Comparative Examples 1 and 2. The spin coating process was carried out at a rotational speed of about 2,000 to about 3,000 rpm. The coating film thus obtained had a thickness of about 0.4 μm. The coating film was dried at a temperature of about 30° C. for about 60 seconds, and then baked in an oven maintained at a temperature of about 180° C. under a nitrogen atmosphere for about 60 seconds. As a result, an anti-reflective film having a thickness of about 0.2 μm was formed on the substrate. Optical characteristics of the anti-reflective film and an amount of fume generated from the anti-reflective film were evaluated. The results are shown in Table 1.

TABLE 1

|  | Example 2 | Comparative Example 1 | Comparative Example 2 |
|---|---|---|---|
| Refractive Index (n) | 1.79 | 1.53 | 1.47 |
| Absorption Index (k) | 0.30 | 0.52 | 1.35 |
| Amount of Fume [%] | 19 | 100 | — |

As illustrated in Table 1, the anti-reflective coating composition prepared in Example 2 had a refractive index (n) of about 1.79 and an absorption index (k) of about 1.30, both of which may be contained proper ranges of optical constants that may be applied to a photolithography process. However, the anti-reflective coating composition prepared in Comparative Example 1 had a refractive index of about 1.53 and an absorption index of about 0.52, and the anti-reflective coating composition prepared in Comparative Example 2 had a refractive index of about 1.47 and an absorption index of about 1.35. The refractive index and the absorption index of the anti-reflective films were measured using an ellisometer. It may be noted that the anti-reflective coating composition according to example embodiments of the present invention may enhance a reflecting property of the anti-reflective film, and may reduce absorption of light of the anti-reflective film. Therefore, the anti-reflective coating composition according to the present invention may be advantageously applied to a photolithography process.

An amount of fume generated from the anti-reflective film was measured using gas phase chromatography while a baking process was performed on a substrate having the anti-reflective film thereon. The amount of fume generated from the anti-reflective film that is formed using the composition of Comparative Example 1 was taken as a basis of 100%. The quantity of fume generated from the anti-reflective film formed using the composition prepared in Example 2 was about five times smaller than that from the anti-reflective film formed using the composition prepared in Comparative Example 1.

A surface of the anti-reflective film was observed using a scanning electron microscope (SEM).

Figure 6:
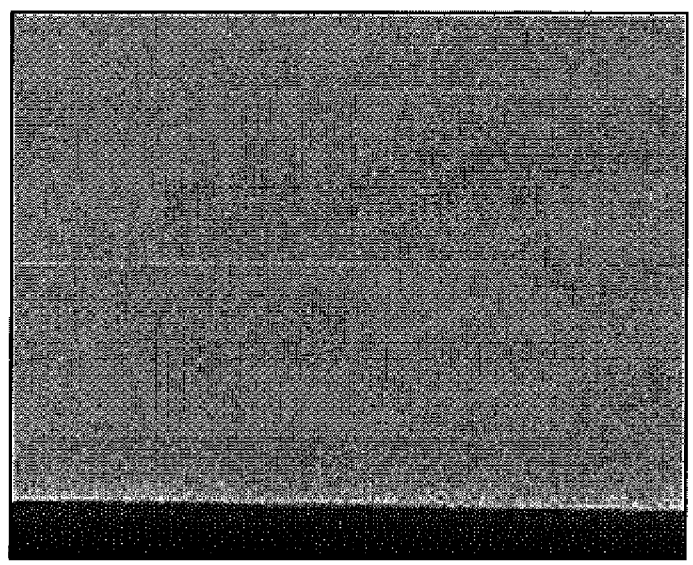
FIG. 6 is a scanning electron microscopic (SEM) image showing a surface of an anti-reflective film formed using a composition prepared in Example 2.
Figure 7:
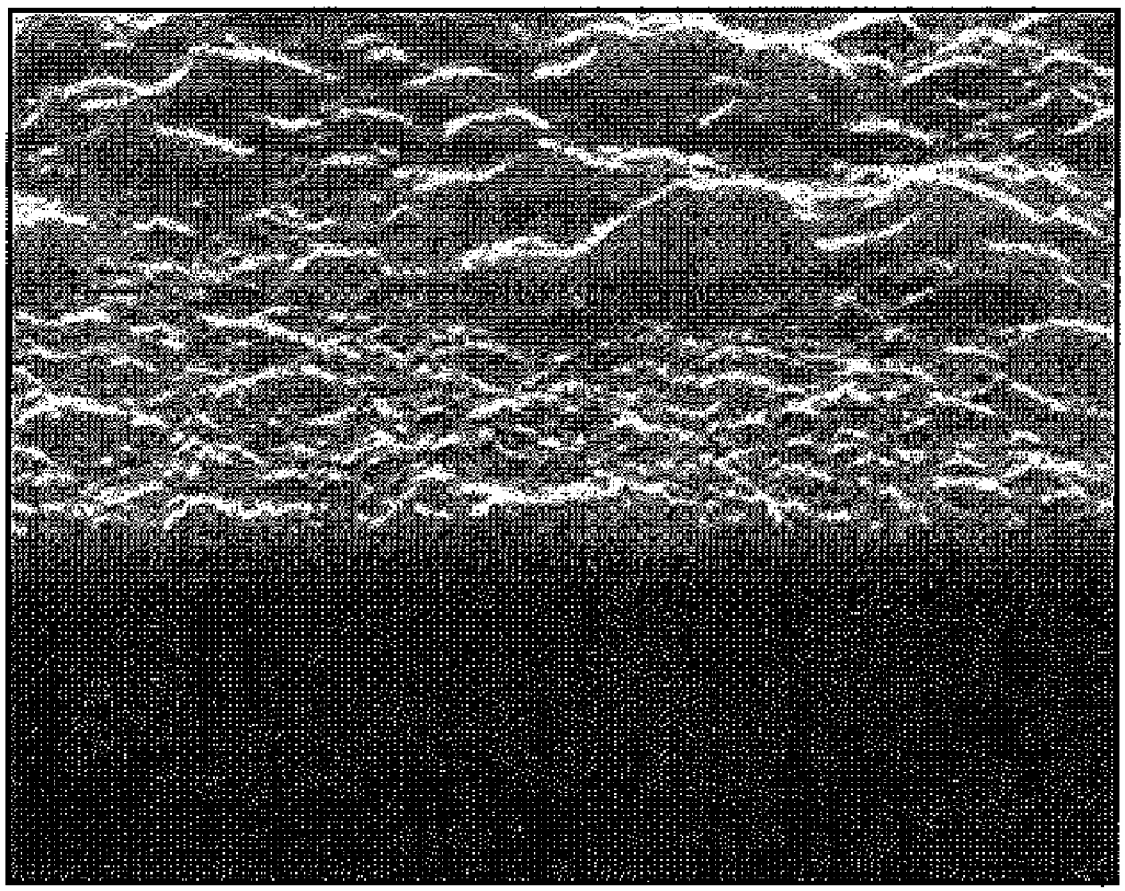
FIG. 7 is an SEM image showing a surface of an anti-reflective film formed using a composition prepared in Comparative Example 1.

FIG. 6 is an SEM image showing a surface of the anti-reflective film formed using the composition prepared in Example 2, and FIG. 7 is an SEM image showing a surface of the anti-reflective film formed using the composition prepared in Comparative Example 1.

Referring to FIGS. 6 and 7, it may be noted that a surface uniformity and a flatness of the anti-reflective film formed using the composition prepared in Example 2 are favorable, whereas the anti-reflective film formed using the composition prepared in Comparative Example 1 exhibited poor surface uniformity and flatness.

Evaluation of Thickness Change and Etching Resistance of an Anti-Reflective Film An anti-reflective film was formed on a substrate using each of the anti-reflective coating compositions prepared in Example 2 and Comparative Examples 1 and 2. A photoresist coating film was formed on the anti-reflective film by spin coating the substrate with a positive photoresist composition including a photoacid generator and a polyhydroxystyrene resin, and then the photoresist coating film was dried at a temperature of about 90° C. for about 90 seconds. As a result, a photoresist film having a thickness of about 2,600 Å was formed on the anti-reflective film. Subsequently, the photoresist film was exposed to light through a photo mask which was positioned on a mask stage of an exposure apparatus. The exposure process was carried out using light having a wavelength of about 193 nm. The photoresist film was baked at a temperature of about 110° C. for about 90 seconds, and then the photoresist film was developed using 2.38 percent by weight of tetramethylammonium hydroxide aqueous solution to thereby form a photoresist pattern on the anti-reflective film.

A thickness of the anti-reflective film was measured before and after the baking process was performed on the photoresist film. It was observed that thicknesses of the anti-reflective films formed using the compositions prepared in Comparative Examples 1 and 2 were substantially reduced after the baking process was performed, whereas a thickness of the anti-reflective film was not substantially reduced after the baking process was carried out.

In addition, an anti-reflective film was formed on a substrate using each of the compositions prepared in Example 2 and Comparative Examples 1 and 2, and then a thickness of the anti-reflective film was measured. After an etching process was performed on the anti-reflective film under the same conditions, a thickness of the anti-reflective film was measured again. A thickness change corresponding to an etching amount of the anti-reflective film is shown in Table 2.

TABLE 2

|  | Etching Amount [Å] |
| --- | --- |
| Example 2 | 269 |
| Comparative Example 1 | 289 |
| Comparative Example 2 | 329 |

As illustrated in Table 2, it may be confirmed that the anti-reflective film formed using the composition prepared in Example 2 may have an enhanced etching resistance compared with the anti-reflective films formed using the compositions prepared in Comparative Examples 1 and 2.

Evaluation of a Photoresist Pattern

An anti-reflective film was formed on a substrate using each of the anti-reflective coating compositions prepared in Example 2 and Comparative Examples 1 and 2. A photoresist film was formed on the anti-reflective film by a spin coating process. The spin coating process was carried out at a rotational speed of about 2,000 to about 3,000 rpm. A photoresist pattern was formed on the anti-reflective film by patterning the photoresist film. A method of forming the photoresist pattern is substantially the same as the method described in evaluation of thickness change and etching resistance of an anti-reflective film. A profile of the photoresist pattern was examined along with a degree of generated defects to the photoresist pattern, if any. The degree of the generated defects was examined by performing an ADI process (a post-development inspection process) on the photoresist pattern, and a vertical profile and a line width roughness of the photoresist pattern were estimated using an SEM. The results are shown in Table 3.

TABLE 3

|  | Defect Evaluation | Profile |
| --- | --- | --- |
| Example 2 | Excellent | Good |
| Comparative Example 1 | Good | Bad |
| Comparative Example 2 | Normal | Bad |

As shown in Table 3, a quantity of defects generated in the photoresist pattern formed using the composition prepared in Example 2 was very small and negligible, and a vertical profile and a line width roughness (LWR) of the photoresist pattern were good. However, it was observed that the photoresist patterns formed using the compositions prepared in Comparative Examples 1 and 2 had a poor profile and a relatively larger occurrence of defects.

According to embodiments of the present invention, the polymer for an anti-reflective coating includes a derivative of muramic acid and a derivative of mandelic acid so that the anti-reflective coating composition including the polymer may enhance a thickness uniformity and an etching resistance of the anti-reflective film. Additionally, the anti-reflective film formed using the anti-reflective coating composition may exhibit favorable stability when exposed to an organic solvent or heat due to cross-linking between chains of the acrylate polymer. Thus, the anti-reflective coating composition may reduce the generation of fumes from the anti-reflective film and suppress a thickness loss of the anti-reflective film while a baking process is carried out so as to form a photoresist pattern on the anti-reflective film. Therefore, the anti-reflective coating composition may improve a profile of a pattern and/or a photoresist pattern.

The foregoing is illustrative of the present invention and is not to be construed as limiting thereof Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A polymer for an anti-reflective coating, comprising:
a polymer prepared by a condensation reaction of an acrylate polymer having a hydroxyl group with a first compound represented by Formula 1 and a second compound represented by Formula 2,

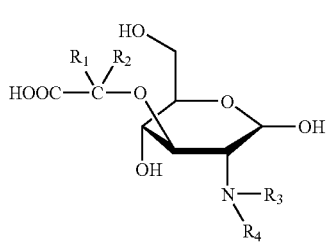

(1)

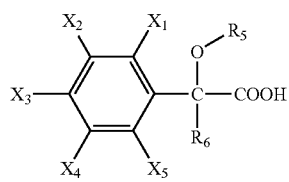

(2)

wherein $R_1$ and $R_2$ independently denote a hydrogen atom or a $C_1$-$C_4$ alkyl group, $R_3$ and $R_4$ independently denote a hydrogen atom, a $C_2$-$C_6$ alkylcarbonyl group or a $C_1$-$C_4$ alkyl group, $R_5$ denotes a hydrogen atom or a $C_2$-$C_6$ alkylcarbonyl group, $R_6$ denotes a hydrogen atom or a $C_1$-$C_4$ alkyl group, and $X_1$, $X_2$, $X_3$, $X_4$ and $X_5$ independently denote a hydrogen atom, a hydroxyl group, a $C_1$-$C_4$ alkyl group or a $C_1$-$C_4$ alkoxy group.

2. The polymer of claim 1, wherein the first compound represented by Formula 1 comprises at least one selected from the group consisting of N-acetylmuramic acid and muramic acid.

3. The polymer of claim 1, wherein the second compound represented by Formula 2 comprises at least one selected from the group consisting of 4-hydroxy-3-methoxymandelic acid, mandelic acid and acetylmandelic acid.

4. The polymer of claim 1, wherein the polymer comprises the first compound in a range of about 0.0015 to about 0.0023 percent by weight based on a total weight of the polymer.

5. The polymer of claim 1, wherein the polymer comprises the second compound in a range of about 0.0008 to about 0.0013 percent by weight based on a total weight of the polymer.

6. The polymer of claim 1, wherein the polymer is prepared by using a cross-linking agent together with the acrylate polymer, the first compound and the second compound.

7. An anti-reflective coating composition, comprising:
a solvent; and
about 20 to about 35 percent by weight of a polymer prepared by a condensation reaction of an acrylate polymer having a hydroxyl group with a first compound represented by Formula 1 and a second compound represented by Formula 2;

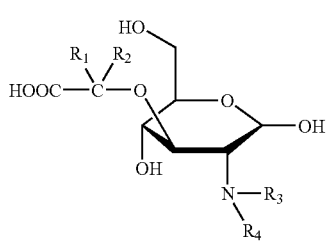

(1)

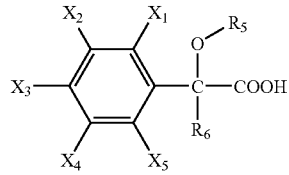

(2)

wherein $R_1$ and $R_2$ independently denote a hydrogen atom or a $C_1$-$C_4$ alkyl group, $R_3$ and $R_4$ independently denote a hydrogen atom, a $C_2$-$C_6$ alkylcarbonyl group or a $C_1$-$C_4$ alkyl group, $R_5$ denotes a hydrogen atom or a $C_2$-$C_6$ alkylcarbonyl group, $R_6$ denotes a hydrogen atom or a $C_1$-$C_4$ alkyl group, and $X_1$, $X_2$, $X_3$, $X_4$ and $X_5$ independently denote a hydrogen atom, a hydroxyl group, a $C_1$-$C_4$ alkyl group or a $C_1$-$C_4$ alkoxy group.

8. The anti-reflective coating composition of claim 7, wherein the solvent comprises at least one selected from the group consisting of ethylene glycol monomethyl ether, ethylene glycol monoethyl ether, methylcellosolve acetate, ethylcellosolve acetate, diethylene glycol monomethyl ether, diethylene glycol monoethyl ether, propylene glycol methyl ether, propylene glycol methyl ether acetate, propylene glycol propyl ether acetate, diethylene glycol dimethyl ether, ethyl lactate, toluene, xylene, methyl ethyl ketone, cyclohexanone, 2-heptanone, 3-heptanone, 4-heptanone, γ-butyrolactone and N-methyl-2-pyrrolidone.

9. The anti-reflective coating composition of claim 7, wherein the polymer comprises the first compound in a range of about 0.0015 to about 0.0023 percent by weight based on a total weight of the polymer, and the polymer comprises the second compound in a range of about 0.0008 to about 0.0013 percent by weight based on a total weight of the polymer.

10. A method of forming a pattern on a substrate, comprising:
forming a layer on the substrate;
forming an anti-reflective film on the layer using an anti-reflective coating composition that includes a solvent and about 20 to about 35 percent by weight of a polymer, the polymer prepared by a condensation reaction of an acrylate polymer including a hydroxyl group with a first compound and a second compound;
forming a photoresist pattern on the anti-reflective film; and
sequentially etching the anti-reflective film and the layer using the photoresist pattern as an etching mask to form an anti-reflective pattern and the pattern on the substrate,
wherein the first and second compounds are respectively represented by Formula 1 and Formula 2,

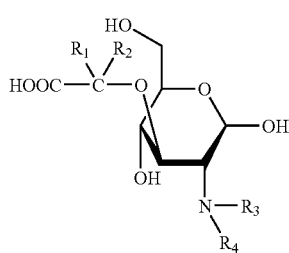

(1)

-continued

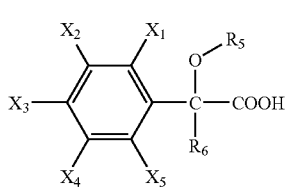

(2)

wherein $R_1$ and $R_2$ independently denote a hydrogen atom or a $C_1$-$C_4$ alkyl group, $R_3$ and $R_4$ independently denote a hydrogen atom, a $C_2$-$C_6$ alkylcarbonyl group or a $C_1$-$C_4$ alkyl group, $R_5$ denotes a hydrogen atom or a $C_2$-$C_6$ alkylcarbonyl group, $R_6$ denotes a hydrogen atom or a $C_1$-$C_4$ alkyl group, and $X_1$, $X_2$, $X_3$, $X_4$ and $X_5$ independently denote a hydrogen atom, a hydroxyl group, a $C_1$-$C_4$ alkyl group or a $C_1$-$C_4$ alkoxy group.

11. The method of claim 10, wherein forming the anti-reflective film on the layer comprises:

forming a preliminary anti-reflective film on the layer by coating the layer with the anti-reflective coating composition; and baking the preliminary anti-reflective film.

12. The method of claim 10, wherein the polymer comprises the first compound in a range of about 0.0015 to about 0.0023 percent by weight and the second compound in a range of about 0.0008 to about 0.0013 percent by weight based on a total weight of the polymer.

13. The method of claim 10, wherein forming the photoresist pattern on the anti-reflective film comprises:

forming a photoresist film on the anti-reflective film; exposing the photoresist film to light; and developing the photoresist film to form the photoresist pattern on the anti-reflective film.

14. The method of claim 13, further comprising baking the photoresist film after the photoresist film is exposed to the light.

* * * * *